United States Patent
Bates (12)

(10) Patent No.: US 6,339,505 B1
(45) Date of Patent: Jan. 15, 2002

(54) METHOD FOR RADIATION PROJECTION AND LENS ASSEMBLY FOR SEMICONDUCTOR EXPOSURE TOOLS

(75) Inventor: Allan Keith Bates, Gloucester, MA (US)

(73) Assignee: International Business Machines Corporation, Armonk, NY (US)

( * ) Notice: Subject to any disclaimer, the term of this patent is extended or adjusted under 35 U.S.C. 154(b) by 12 days.

(21) Appl. No.: 09/603,682

(22) Filed: Jun. 26, 2000

(51) Int. Cl.$^7$ .............................. G02B 3/00; G02B 9/00; G03B 27/54; C03C 3/04; C03C 4/00
(52) U.S. Cl. ...................... 359/642; 359/796; 359/797; 355/52; 355/53; 355/67; 501/53; 501/900; 501/905
(58) Field of Search .............................. 355/52, 53, 67; 359/350, 355, 642, 646, 652, 741, 796, 797; 501/53, 54, 900, 905; 430/4, 296

(56) References Cited

U.S. PATENT DOCUMENTS

| | | | |
|---|---|---|---|
| 4,474,463 A | 10/1984 | Heimer | 355/71 |
| 5,170,207 A | 12/1992 | Tezuka et al. | 355/53 |
| 5,517,279 A | 5/1996 | Hugle et al. | 355/46 |
| 5,616,159 A * | 4/1997 | Araujo et al. | 65/17.4 |
| 5,668,067 A * | 9/1997 | Araujo et al. | 501/54 |
| 5,891,605 A * | 4/1999 | Stanton | 430/296 |
| 5,896,222 A | 4/1999 | Rosplock et al. | 359/355 |
| 5,978,070 A | 11/1999 | Sakuma et al. | 355/53 |
| 5,982,558 A | 11/1999 | Fürter et al. | 359/649 |
| 6,087,283 A * | 7/2000 | Jinbo et al. | 501/54 |
| 6,242,136 B1 * | 6/2001 | Moore et al. | 430/5 |

OTHER PUBLICATIONS

Behavior of Fused Silica Under 193nm Irradiation, Technology Transfer # 00073974A–TR, Internatinal SEMATECH, Jul. 25, 2000.*

ArF Laser Induced Absorption in Fused Silica Exposed to Low Fluence at 2000Hz, Optical Microlithography XIV, proceedings of SPIE vol. 4346, Mar. 2, 2001.*

* cited by examiner

Primary Examiner—Russell Adams
Assistant Examiner—Rodney E Fuller
(74) Attorney, Agent, or Firm—Ratner & Prestia; Tiffany L. Townsend, Esq.

(57) ABSTRACT

A lens assembly with materials that densify and rarefy as a function of radiation dose. The lens assembly can be provided for use in photolithographic exposure tools. The combination of densifying and rarefying materials in the lens elements of exposure tools compensates for changes in the index of refraction of the materials. The lens assembly of the present invention corrects, by design, for radiation-induced changes in the indices of refraction of the lens element materials. By compensating for radiation-induced changes, the lens assembly has a longer useful lifetime.

28 Claims, 3 Drawing Sheets

METHOD FOR RADIATION PROJECTION AND LENS ASSEMBLY FOR SEMICONDUCTOR EXPOSURE TOOLS

BACKGROUND OF THE INVENTION

1. Field of the Invention

The present invention relates generally to methods of projecting radiation and lens assemblies for photolithography exposure tools and, more particularly, to projection methods and lens assemblies that correct for lens densification due to radiation exposure.

2. Description of Related Art

In integrated circuit device fabrication, photolithographic processes typically project radiation of a predetermined wavelength through a patterned mask called a reticle. The mask has a circuit patterned formed on it. The radiation transmitted through the mask is further transmitted through a reduction lens so that an image of the circuit pattern is projected onto a layer of an energy-sensitive photoresist (or resist) material coated on a semiconductor substrate. The step of transmitting the radiation through the patterned mask thereby transfers an image of the mask pattern into the energy-sensitive material. The image is then developed in the energy-sensitive material and transferred onto the underlying substrate. An integrated circuit device is fabricated using a series of such exposures to pattern different layers formed on a semiconductor substrate.

U.S. Pat. No. 4,474,463 issued to Heimer discloses one relatively early example of a mask illumination system for use in the production of semiconductor devices. The disclosed system includes an optical assembly having an internal focal plane corresponding to the mask. A reticle edge masking assembly (REMA) is located at the internal focal plane and serves to define a pattern of light which is projected onto the mask. The provision of the reticle edge masking assembly in a focal plane separate from the mask plane serves to reduce blurriness caused by near field diffraction, as well as facilitating the use of more complex REMA assemblies.

U.S. Pat. No. 5,982,558 issued to Fürter et al. focuses on the REMA objective for a microlithographic projection exposure system. The REMA objective images an object plane onto the reticle plane and has a lens group disposed in the half of the objective close to the reticle. The object plane lies at a finite spacing. In the lens group, the principal ray elevations are greater in magnitude than the elevations of the peripheral rays. A specifically defined scattering surface is arranged in the lens group.

U.S. Pat. No. 5,170,207 issued to Tezuka et al. discloses a projection lens system well-fit for baking integrated circuit patterns onto silicon wafers (or substrates) using a light source having wavelengths ranging from an ultraviolet wavelength zone to a vacuum ultraviolet wavelength zone. This projection lens system is characterized by a plurality of lens elements including a Fresnel lens element having negative dispersion characteristics. The Fresnel lens is located at a particularly defined position in the projection lens system.

U.S. Pat. No. 5,517,279 issued to Hugle et al. focuses on the lenses of a photolithography system. Specifically, Hugle et al. disclose a lens array that can be used as an exposure tool for microlithography. The lens array can be as thin as ¹⁄₄₀ of the thickness of a printed page, yet the arrangement of optical lenses can be powerful enough to replace very sophisticated, bulky, and expensive precision optics. The array of lenses can be fabricated with binary optical device and other techniques.

As technology advances, the need to provide more integrated circuit devices on a single chip becomes more pronounced. Consequently, the sizes of the individual devices on a chip are getting smaller. As the sizes of the devices decrease, the wavelength of the radiation used to pattern the energy-sensitive material must also decrease. For devices in the range of 0.35 μm to 0.18 μm, the wavelength of the exposing radiation must be in the range of about 190 nm to about 350 nm, referred to as the deep ultraviolet or deep-UV range.

The use of shorter wavelengths in photolithography poses several challenges in the design of optical components. For example, few optical materials are transparent enough at 193 nm to enable the fabrication of high-quality, all refractive or catadioptric systems as required for lithographic lenses. High-purity synthetic fused silica and crystalline calcium fluoride are currently the only practical choices. Technical difficulties surround the use of calcium fluoride, including a lack of experience grinding and polishing calcium fluoride lenses. Therefore, fused silica is currently the preferred choice for optical lenses in the deep-UV applications. Improvements in production control are needed, however, to supply quality fused silica in production quantities.

U.S. Pat. No. 5,896,222 issued to Rosplock et al. discloses a fused silica lens, a microlithography system including a fused silica lens, and a method of making a fused silica lens. The fused silica lens transmits ultraviolet radiation having a wavelength below 300 nm with controlled optical damage and inhibited red fluorescence during such transmission. The method of manufacturing the lens includes thermally converting a polymethylsiloxane precursor to fused silica particles, consolidating the particles into a body, and forming from the fused silica body an optical lens that transmits ultraviolet radiation, that incurs optical damage up to a certain level when transmitting radiation below a wavelength of 300 nm., that does not incur an absorption transition at any level, that becomes saturated and incurs essentially no significant further damage, and in which the red fluorescence diminishes while further transmitting such radiation.

The use of optical materials in the deep UV regime is not only subject to transparency restrictions, but also to limitations due to the susceptibility of such materials to photo-induced deformation. The physical properties of some materials are altered upon exposure to deep UV radiation. The most serious of these physical alterations is densification. Fused silica exhibits compaction upon extended exposure to 193 nm radiation. Compaction, or densification, is a decrease in the volume of the material with a corresponding increase in the index of refraction in the densified region. Densification of a fused silica lithographic lens causes wavefront distortion. This densification degrades the quality of photolithography in integrated circuit fabrication, resulting in reduced yields and increased costs for semiconductor production.

Because densification of fused silica is a function of radiation exposure, densification is considered the limiting factor on allowable power densities within the lithography field. The densification of the fused silica often used in photolithography processes is a function of the number of laser pulses and the peak intensities of the pulses. Densification increases linearly with the number of pulses and increases quadratically with the peak intensity of the laser pulse.

Excimer laser pulses are extremely short (typically between 5 and 20 ns FWHM). Therefore, high peak intensities are generated by even modest average intensities when excimer laser light sources are used. Excimer laser light sources are very popular because the monochromatic light provides for precise focusing and alignment in photolithographic applications.

U.S. Pat. No. 5,978,070 issued to Sakuma et al. is one example of the incorporation of an excimer laser in a projection exposure apparatus capable of projecting and exposing mask pattern images onto a substrate using an optical projection system. The disclosed apparatus has (1) an optical illumination system capable of illuminating a mask using an excimer laser illuminating light source in a wavelength range of 230 nm or less; and (2) an optical projection system which includes as one optical member a calcium fluoride crystal with a total alkaline earth metal impurity content of $1 \times 10^{18}$ atom/cm$^3$ or less and which projects images of the mask pattern onto a substrate. Sakuma et al. also disclose the method by which the calcium fluoride crystal is manufactured.

As a result of the high peak intensities characteristic of excimer lasers, however, considerable optical densification of materials occurs. This optical densification causes wavefront distortion, which in turn causes degraded optical imaging performance resulting in reduced yields and increased costs for semiconductor production. Thus, optical densification limits the useful life of lithographic lenses, and the current solution to this problem is to replace the lenses.

As technology demands the use of shorter wavelength radiation in the photolithography of semiconductor chips, there is a need for optical systems that are optimized for radiation of wavelengths less than 300 nm.

SUMMARY OF THE INVENTION

To meet this and other needs, and in view of its purposes, the present invention offers a solution to the problem of densification which otherwise limits the useful lifetime of lithographic lenses. The present invention provides a lens assembly having a first lens element of a material that densifies upon exposure to radiation, and a second lens element of a material that rarefies upon exposure to radiation. The densification or rarefaction of the material results in a corresponding change in the index of refraction of the material. Because this change occurs in opposite directions depending on whether the material densifies or rarefies, a combination of two lenses made with such complementary materials compensates for errors introduced by the change in the refractive index as a result of densification or rarefaction of a lens element when exposed to radiation. Such phenomenon is particularly noticeable when the radiation is laser radiation of a wavelength under 300 nm, especially when an excimer laser radiation of about 193 nm is used.

The present invention also provides a photolithographic exposure apparatus including a lens assembly. The assembly has a first lens element of a material that densifies upon exposure to radiation, and a second lens element of a material that rarefies upon exposure to radiation. The combination of two lenses made with such complementary materials compensates for errors introduced by densification or rarefaction.

The present invention discloses a method of projecting radiation comprising projecting radiation from a first lens element onto a second lens element. An index of refraction of the first lens element and an index of refraction of the second lens element each change upon exposure to radiation. The first lens element index of refraction changes in an opposite direction from a change in the second lens element index of refraction. A method for correcting wavefront distortion due to lens densification in a first lens element is also provided. The method comprises adding a second lens element which rarefies upon exposure to radiation.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 2:
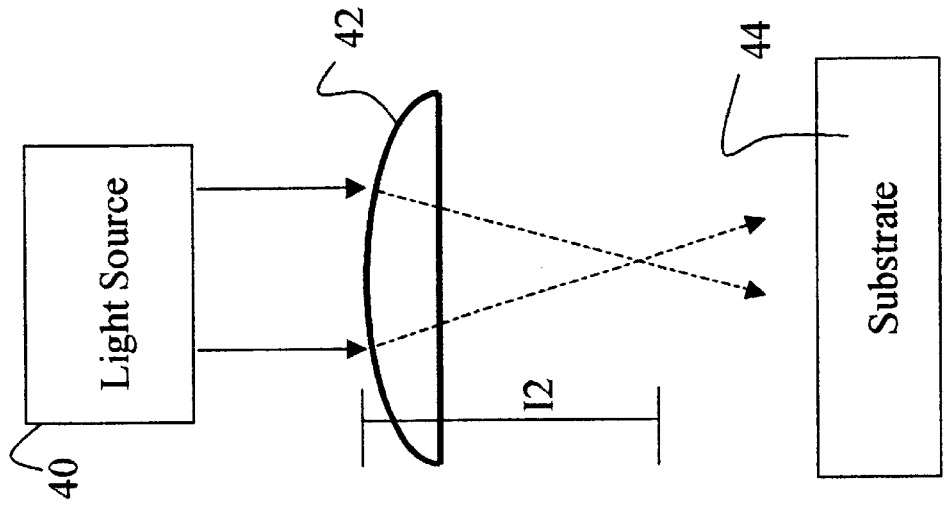
FIG. 2 is a schematic illustration of the optical components and path of a conventional lens system showing the focal length reduction because of densification of the lens material.

The invention will next be described with reference to the figures in which same numbers indicate the same parts in all figures. The present invention provides an optical system that combines lens elements fabricated from different materials that density and rarefy upon exposure to radiation. Rarefying lens elements are made of materials that expand with exposure to radiation of less than about 300 nm in wavelength, known as deep UV radiation. Although the rarefaction phenomenon is not exhibited in materials as frequently as the densification phenomenon, it has been surprisingly discovered that certain commercially available grades of fused silica demonstrate rarefaction upon exposure to deep UV radiation. The present invention exploits this physical phenomenon by combining densifying and rarefying materials in a lens assembly to correct for wavefront distortions due to radiation-induced changes in the lens materials.

Materials

Although other materials may also exhibit similar changes in the physical properties described, it has been observed that the volume of fused silica changes with exposure to deep UV radiation: the material may compact or expand. The compaction process is referred to as densification and the expansion process is referred to as rarefaction. Some commercially available, excimer-grade fused silica materials exhibit densification, while others exhibit rarefaction upon exposure to radiation of wavelength less than 300 nm. Variations in the silica source, manufacturing process, or the nature of contaminants may all contribute to the disparity in the response of the materials to deep UV radiation exposure.

When fused silica is used to make optical lens elements, the radiation-induced densification and rarefaction of the material causes a change in the index of refraction of the lens elements. The index of refraction changes from a first value when the lens element is not exposed to incident radiation to a second value when the lens element is exposed to radiation. Accordingly, an alteration in the index of refraction distorts the optical path of the lens element.

Radiation-induced changes in the index of refraction can be determined empirically for samples of fused silica. Changes in the index of refraction can be measured by an interferometer as a function of radiation dose. The changes in the index of refraction are opposite for densifying and rarefying materials. The index of refraction increases in densifying materials and this change in the index of refraction has a positive linear dependence on radiation dose. Conversely, the index of refraction decreases in rarefying materials and the change in the index of refraction has a negative linear dependence on radiation dose.

The changes in the index of refraction of rarefying and densifying materials are opposite, and they may be equal and opposite by design. Densification scales linearly with the thickness of the material. Therefore, the densification of a lens element can be controlled by the thickness of the lens material. In the present invention, a lens assembly is created which combines the rarefaction and densification properties. The lens assembly optimizes the thickness of materials to achieve the maximum compensation for radiation-induced wavefront distortion.

The index of refraction of materials may also vary as a function of the fluence of the incident radiation. The fluence refers to the radiation beam intensity per unit area and may vary at different points in an exposure apparatus or lens assembly. In addition to fluence dependence, some materials may also exhibit a variation in index of refraction as a function of the polarization of the incident radiation. The response of a particular material to beam fluence or to linearly or circularly polarized radiation may also be incorporated in selecting materials for use in the present invention.

One method of assessing the densification and rarefaction properties of different materials containing fused silica is to use an interferometer to measure the change in the index of refraction as a function of radiation dose. Any material that exhibits a change in index of refraction may be used in the present invention. The preferred materials for use in the present invention are excimer-grade fused silica materials from manufacturers such as ShinEtsu Glass (Japan) and Corning Glass (USA).

Optical Systems

Figure 1:
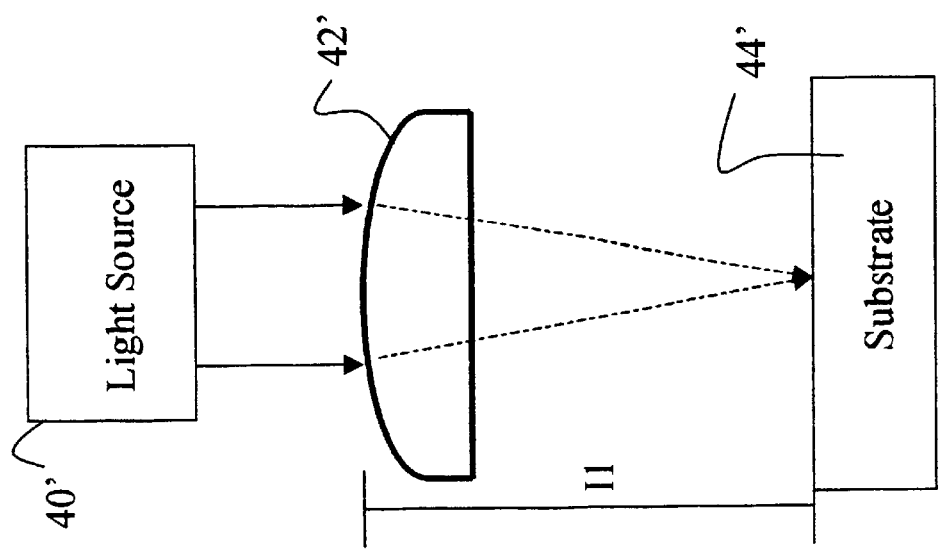
FIG. 1 is a schematic illustration of the optical components and path of a conventional lens system.

Material densification causes an increase in the index of refraction for the lens element. The increased index of refraction results in a longer optical path length. This effect is shown schematically in FIGS. 1 and 2. FIG. 1 illustrates the optical path for light through a lens exposed to a low dose of deep UV radiation. A light source 40' emits radiation and a lens 42' focuses the light on the substrate 44' with a focal length of l1. FIG. 2 illustrates the optical path for light through a fused silica lens exposed to a higher dose of deep UV radiation. The effect of densification on the optical path length is apparent with this higher dose of deep UV radiation. The increased index of refraction results in a shorter focal length for a positive lens. As shown in FIG. 2, the light source 40 emits a high dose of radiation in the deep UV range and the lens 42 densifies. The densification of the lens alters the index of refraction, which results in a shorter focal length l2. Consequently, the lens 42 no longer focuses the light on the substrate 44.

Figure 4:
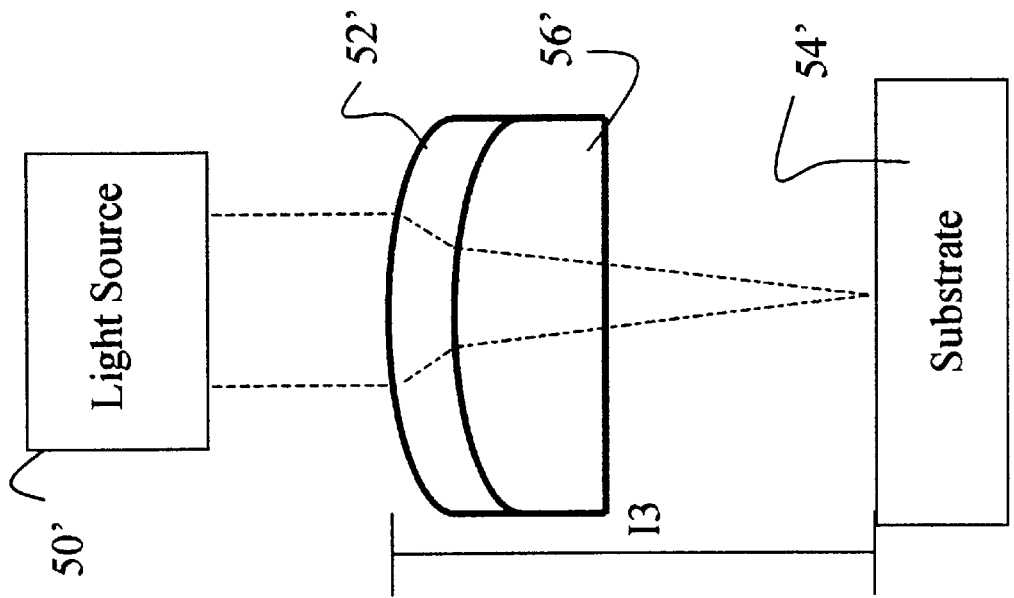
FIG. 4 is a schematic illustration of the optical components and path of the present invention with exposure to high dose radiation.
Figure 3:
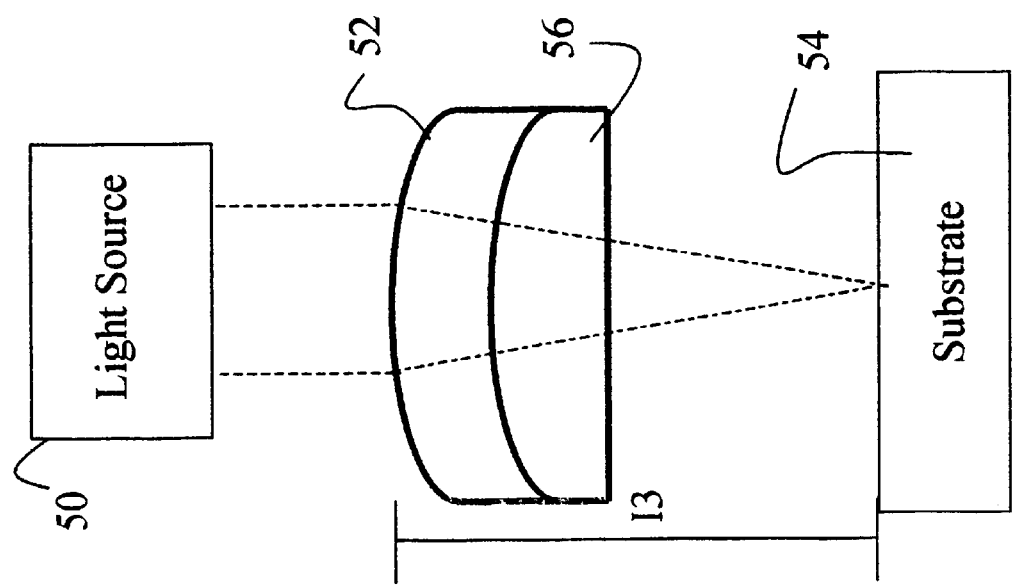
FIG. 3 is a schematic illustration of the optical components and path of the present invention.

Currently, lens elements have to be replaced at periodic intervals to correct for the wavefront distortion caused by densification. FIGS. 3 and 4 schematically show how the current invention extends the useful life of lens elements in exposure tools that project high doses of deep UV radiation. A light source 50 emits deep UV radiation. At low radiation doses (FIG. 3), the lens elements 52 and 56 are substantially aligned in a lens assembly that creates a focal length l3. First lens element 52 is formed from materials that densify and second lens element 56 is formed from materials that rarefy. The lens elements 52 and 56 are arranged in reference to each other to provide a desired focal length l3 so that the lens elements 52 and 56 focus the light from the light source 50 on the substrate 54.

FIG. 4 shows the configuration of FIG. 3 after high dose radiation exposure from light source 50'. With radiation exposure, the first lens element 52' densifies. The densification causes an increase in the index of refraction, as illustrated in FIG. 2. The distorted wavefront from the first densified lens element 52' passes through a second lens element 56', which rarefies with exposure to deep UV radiation. The rarefaction of the second lens element 56' causes a decrease in the index of refraction which corrects for the change in the index of refraction of the first lens element 52'. As a result, the focal length through the combined lens elements 52', 56' remains unchanged through low and high dose exposure. Focal length l3 in FIG. 4 is unchanged from the low dose optical path length l3 in FIG. 3 (and, if so designed, from the low dose optical path length l1 in FIG. 1). Consequently, the combined lens elements 52', 56' continue to focus the light on the substrate 54'.

The densifying and rarefying lenses are designed such that the volumes change equally but oppositely with increasing exposure to deep UV radiation. Conventional optical systems for photolithography exposure tools use lens elements of fused silica (or alternatively calcium fluoride). If a single lens element is used and the material densities, the wavefront is distorted during the exposure process. In the present invention, as shown in FIGS. 3 and 4, a second lens element 56, 56' is used in combination with the first lens element 52, 52'. The second lens element 56, 56' is made of excimer-grade fused silica that has been shown empirically to rarefy with exposure to deep UV radiation. Rarefaction of the material of the second lens element 56, 56' causes the index of refraction to decrease. The decreased index of refraction reduces the optical path length, as shown by the dashed lines through lens element 56' of FIG. 4. The combination of the wavefront distortions due to the densification of the first lens element 52' in FIG. 4 and the rarefaction of the second lens element 56' results in a wavefront fully corrected and free of any distortions due to altered indices of refraction.

The lens assembly of the present invention can be applied in any conventional exposure tool or stepper machine used in semiconductor fabrication to extend the useful lifetime of the illumination or projection lenses. In one preferred embodiment, the lens elements are incorporated into a projection objective for microlithographic projection exposure systems. A schematic of an exposure apparatus utilizing the optical system of the present invention is shown in FIG. 5.

Figure 5:
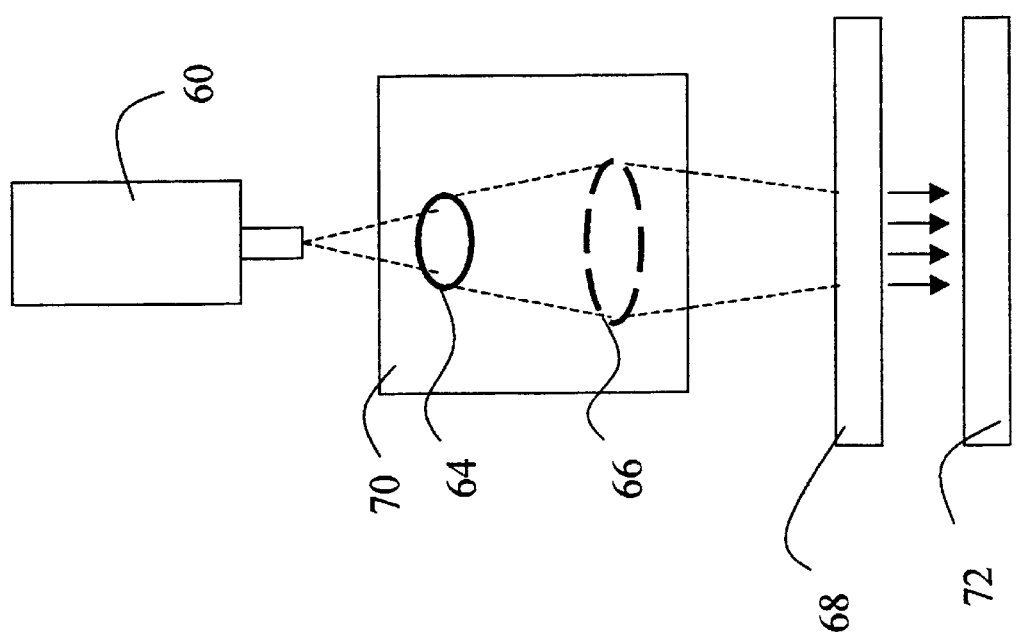
FIG. 5 is a schematic of a photolithography exposure apparatus incorporating the lens assembly of the present invention.

In FIG. 5, a light source 60 emits radiation in the range of less than 300 nm. In one preferred embodiment of the present invention, the light source is an ArF excimer laser emitting 193 nm radiation. Radiation from the light source 60 is represented by dashed lines in FIG. 5. The laser radiation is delivered to the mask 68 by the exposure apparatus 70. The exposure apparatus 70 may include any number of components, including fused silica lens elements. In the exposure apparatus 70, a first lens element 64 is made of fused silica that densifies with extended exposure to deep UV radiation. A second lens element 66 is made of fused silica that rarefies with extended exposure to deep UV radiation. The first and second lens elements are made of materials selected to completely compensate for their radiation-induced physical alterations. The rarefying lens element 66 increases in volume and the densifying lens element 64 decreases in volume upon exposure to deep UV radiation.

The thicknesses of the lens elements 64, 66 are also determined to maximize the compensatory effects with exposure to deep UV radiation. The lens elements 64, 66 are positioned and designed such that lens element 64 incurs higher fluence radiation than does lens element 66. The lens elements 64, 66 are designed such that their respective indices of refraction change with the same dependence on radiation dose, or alternatively their respective indices of refraction change an appropriate amount such that the lens assembly meets the design specifications throughout the life of the lens assembly. In accordance with the present invention, the lens elements 64, 66 may also be arranged such that radiation passes through the rarefying lens element 66 before it is transmitted through the densifying lens element 64. Another embodiment includes positioning a rarefying lens element in a region of high fluence, while a compensating densifying lens element is positioned in a low fluence region of the exposure apparatus.

Again referring to FIG. 5, an exposure apparatus using the lens assembly of the present invention exposes the mask 68 with a wavefront undistorted by densification effects. In a typical exposure tool, the mask pattern is projected onto a substrate 72. The materials and design of the fused silica lens elements 64, 66 are optimized such that the wavefront distortion due to exposure-induced changes in focal length are minimized.

The lens assembly of this invention is described by the above example, but is not intended to be limited thereby. The lens assembly of the present invention could be incorporated into any appropriate component of an exposure apparatus. The lens assembly of the present invention may contain a plurality of lens elements and may be in a symmetrical arrangement by design or arranged in groups that are not completely symmetrical. Lens assemblies of the present invention may be used in high or low fluence regions or both. In any configuration, lens elements may be designed and positioned such that the densifying and rarefying properties of the lens elements receive compensation from the other lens elements in the lens assembly.

A lens design program, or other known method in the art, can be used to calculate the change in the optical path length based on the appropriate laser energy density illumination over the entire volume of the lens element throughout the entire lifetime of the optical system. Any method used to perform these calculations will account for the changes in the optical path length as well as the changes in the physical thickness of the lens as a result of exposure to the laser irradiation. Lens design software such as CODE V and ZEMAX can be used to perform all the design calculations for this embodiment.

The change in the optical path length for the second lens element 66 is calculated in a similar manner and the calculations account for the optical path length changes caused by a decrease in the index of refraction for this second lens element 66. The lens design program calculates the thickness and surface curvature of each lens element to determine the minimum effect on wavefront deviations throughout the lifetime of the optical system under laser irradiation. The calculations may be optimized by a least squares underconstrained optimization of multiple equations with multiple unknowns. The optimization is accomplished by iterations of the initial design at periodic intervals throughout the expected lifetime of the lens systems. For example, the expected lifetime of the lens system is between 40–100 billion laser pulses for a ten-year lifetime. The optimization may be accomplished by calculating the wavefront change at 1 billion pulse intervals and then optimizing all design aspects over 40 billion pulses. Assembly design aspects include, but are not limited to, the lens material, index of refraction, thickness, surface curvature, and lens position.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A lens assembly comprising a first lens element of a material that densifies upon exposure to radiation, and a second lens element of a material that rarefies upon exposure to radiation.

2. The lens assembly of claim 1 wherein the first and the second lens elements both are fused silica.

3. The lens assembly according to claim 2 wherein the fused silica is excimer-grade fused silica.

4. The lens assembly of claim 1 wherein the first and second lens elements each have a variable index of refraction, the index of refraction changing from a first value when the lens element has not been exposed to radiation and a second value when the lens element has been exposed to incident radiation, and wherein the first lens element index of refraction changes in opposite direction from the change in the index of refraction of the second lens element.

5. The lens assembly of claim 4 wherein the change in the index of refraction of the first lens element is substantially equal and opposite to the change in the index of refraction of the second lens element.

6. The lens assembly according to claim 4 further comprising a radiation path along which a beam of radiation having an intensity per unit area travels through the lens assembly wherein the lens assembly causes the radiation beam intensity per unit area to vary along the path, and wherein the first and second lens elements are placed along the radiation path at points where the radiation intensity per unit area in each of the points produces in each of the first and second lens elements a substantially equal and opposite change in its index of refraction.

7. The lens assembly of claim 1 wherein the material that densifies upon exposure to radiation and the material that rarefies upon exposure to radiation both do so when the radiation has a wavelength less than 300 nm.

8. The lens assembly of claim 7 wherein the radiation is radiation from an ArF excimer laser and the radiation wavelength is about 193 nm.

9. A photolithographic exposure apparatus comprising a lens assembly, the assembly including a first lens element of a material that densifies upon exposure to radiation and a second lens element of a material that rarefies upon exposure to radiation.

10. The photolithographic exposure apparatus of claim 9 wherein the material that densifies upon exposure to radiation, and the material that rarefies upon exposure to radiation both do so when the radiation has a wavelength less than 300 nm.

11. The photolithographic exposure apparatus of claim 10 wherein the radiation is radiation from an ArF excimer laser and the radiation wavelength is about 193 nm.

12. The photolithographic exposure apparatus of claim 9 further comprising an excimer laser radiation source directing radiation toward the lens assembly and a mask receiving radiation from the lens assembly.

13. The photolithographic exposure apparatus of claim 9 wherein the first and the second lens elements both are fused silica.

14. The photolithographic exposure apparatus of claim 13 wherein the fused silica is excimer-grade fused silica.

15. The photolithographic exposure apparatus of claim 9 wherein the first and second lens elements each have a variable index of refraction, the index of refraction changeable from a first value prior to exposure of the lens element to a second value after exposure of the lens element to incident radiation, and wherein the first lens element index of refraction is adapted to change in an opposite direction from a change in the index of refraction of the second lens element.

16. The photolithographic exposure apparatus of claim 15 wherein the change in the index of refraction of the first lens element is substantially equal and opposite to the change in the index of refraction of the second lens element.

17. The photolithographic exposure apparatus of claim 15 further comprising a radiation path along which a beam of radiation having an intensity per unit area travels through the lens assembly wherein the lens assembly causes the radiation beam intensity per unit area to vary along the path, and wherein the first and second lens elements are placed along the radiation path at points where the radiation intensity per unit area in each of the points produces in each of the first and second lens elements a substantially equal and opposite change in its index of refraction.

18. A lens assembly receiving radiation from an excimer laser with a wavelength less than 300 nm and focusing that radiation on a substrate, the lens assembly comprising a first lens element of excimer-grade fused silica that densifies upon exposure to radiation, and a second lens element of excimer-grade fused silica that rarefies upon exposure to radiation.

19. The lens assembly of claim 18 wherein the first and second lens elements each have a variable index of refraction, the index of refraction changing from a first value when the lens element has not been exposed to radiation and a second value when the lens element has been exposed to incident radiation, and wherein the first lens element index of refraction changes in opposite direction from the change in the index of refraction of the second lens element.

20. The lens assembly according to claim 19 wherein the change in the index of refraction of the first lens element is substantially equal and opposite to the change in the index of refraction of the second lens element.

21. A method of projecting radiation, the method comprising:
   projecting radiation from a first lens element onto a second lens element, wherein an index of refraction of the first lens element and an index of refraction of the second lens element each change upon exposure to radiation, and wherein the first lens element index of refraction changes in an opposite direction from a change in the second lens element index of refraction.

22. The method according to claim 21 wherein the first lens element index of refraction changes an amount essentially equal to and opposite from a change in the second lens element index of refraction.

23. The method according to claim 21 comprising projecting radiation having a wavelength less than 300 nm.

24. The method according to claim 23 comprising projecting radiation having a wavelength of about 193 nm from an ArF excimer laser.

25. The method according to claim 21 further comprising projecting radiation within a photolithographic exposure apparatus.

26. A method for correcting a wavefront distortion due to lens densification in a first lens element, the method comprising adding a second lens element, wherein the second lens element rarefies upon exposure to radiation.

27. The method according to claim 26 further comprising a first index of refraction of the first lens element changing by a first amount as the first lens element densifies, and a second index of refraction of the second lens element changing by a second amount as the second lens element rarefies.

28. The method according to claim 26 wherein the first amount is essentially equal to and opposite from the second amount.

\* \* \* \* \*